(12) United States Patent
Stratton et al.

(10) Patent No.: US 6,570,485 B1
(45) Date of Patent: May 27, 2003

(54) TRANSDUCER PACKAGING ASSEMBLY FOR USE IN SENSING UNIT SUBJECTED TO HIGH G FORCES

(75) Inventors: Thomas G. Stratton, Roseville, MN (US); Terrence D. Bender, Hamel, MN (US); Joel J. Bodin, Chanhassen, MN (US); Reinhart Ciglenec, Katy, TX (US); Frank F. Espinosa, Richmond, TX (US); Edgar R. Mallison, Wayzata, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/715,480

(22) Filed: Nov. 17, 2000

(51) Int. Cl.[7] .................................................. H01L 6/10
(52) U.S. Cl. ........................... 338/42; 338/36; 29/621.1
(58) Field of Search ................................ 338/4, 36, 42; 29/621.1; 73/720, 721, 726, 727, 707

(56) References Cited

U.S. PATENT DOCUMENTS

| | | | |
|---|---|---|---|
| 4,303,903 A | * 12/1981 | Matsuoka et al. | ............. 338/4 |
| 4,361,040 A | 11/1982 | Taplin et al. | |
| 4,658,651 A | 4/1987 | Le | |
| 4,675,643 A | * 6/1987 | Tanner et al. | ................... 338/4 |
| 4,926,155 A | 5/1990 | Colla et al. | |
| 4,944,187 A | * 7/1990 | Frick et al. | .................... 73/718 |
| 5,212,989 A | * 5/1993 | Kodama et al. | ............... 73/706 |
| 5,335,549 A | * 8/1994 | Kato | ............................ 73/706 |
| 5,337,612 A | 8/1994 | Evans | |
| 5,459,351 A | 10/1995 | Bender | |
| 5,721,446 A | 2/1998 | Kobayashi | |
| 5,750,899 A | 5/1998 | Hegner et al. | |
| 5,847,282 A | * 12/1998 | Keller | ......................... 73/706 |

* cited by examiner

*Primary Examiner*—Karl D. Easthom

(57) ABSTRACT

A transducer packaging assembly for use in a sensing unit subjected to high forces of acceleration includes a base having a cavity. A pressure sensitive semiconductor die is bonded to a large backplate having a shape so that it nestles into the cavity but is spaced from a surface of the cavity. A planar cover secured to the base has a hole larger than the die but smaller than the backplate, and thin wires extend from the die to electrical connections on the assembly. A viscous fluid fills a space between the backplate and the cavity, and a space between the backplate and the cover, and transmits a pressure to be measured to the pressure sensitive die. The viscous fluid has a sufficiently high viscosity to oppose movement of the backplate relative to the cavity while cushioning the pressure sensitive die and the backplate from forces of acceleration.

21 Claims, 2 Drawing Sheets

TRANSDUCER PACKAGING ASSEMBLY FOR USE IN SENSING UNIT SUBJECTED TO HIGH G FORCES

BACKGROUND OF THE INVENTION

The present invention relates generally to pressure sensing units and particularly to the packaging of pressure transducers for incorporation into pressure sensors or pressure sensing units so as to withstand very large shock and vibration amplitudes without sustaining damage.

Pressure sensing units that employ implanted semiconductor strain resistors are widely used in many applications. The strain-sensitive resistors are arranged on a silicon die and typically interconnected so as to form a full Wheatstone bridge on one surface. The underside of the die is usually etched to form a thin diaphragm. The edges of the diaphragm correspond to the location of the strain-sensitive resistors, or piezoresistors, where strain is the greatest when the diaphragm undergoes bending as a result of pressure loading on one side. The construction of the diaphragm and placement of the strain-sensitive resistors is dependent on the application and the manufacturer. Circular diaphragms are sometimes used where two resistors in opposite legs of the bridge are positioned radially to the diaphragm and the remaining two resistors in opposite legs of the bridge are positioned tangentially to the diaphragm. In this way the resistors positioned radially will increase resistance with pressure loading and the resistors positioned tangentially will decrease resistance. In high-pressure applications an elongated rectangular diaphragm is more likely to be used. U.S. Pat. Nos. 5,485,753 and 5,295,395, which are assigned to Honeywell Inc., describe a form of pressure sensor diaphragm and method of making that allows for the formation of long rectangular plate structures in semiconducting material, and are hereby incorporated by reference.

A package must be provided for the silicon die and package induced strains contribute to noncompensatable errors such as thermal hysteresis and drift through common adhesive materials like epoxies, which have plastic and creep characteristics. In some pressure measurement applications, these errors cannot be tolerated. This is especially true where high accuracy is required at high temperatures where the errors are more pronounced. A variety of packaging approaches have been used. In one well-known configuration, a pressure sensitive chip or die is attached to a support structure such as a Pyrex™ tube. The combined structure is referred to as a chip-tube, even though the support structure may not be tubular in shape, and may be a rod, a backplate or some other structure. To obtain high performance, the length of the Pyrex™ tube is typically a few tenths of an inch or more in order to separate the die from the attachment of the chip-tube to the remainder of the sensor package. This attachment of the chip-tube to another package material is subject to strains produced, for example, by differences in the temperature coefficient of expansion (TCE) of the chip-tube material and the TCE of the package material. Temperature variations then can cause strains at the junction of the chip-tube and the package and the strains can cause strains at the sensor which introduces errors. A longer chip-tube reduces the effect of these strains. Typical methods of attaching the chip-tube to the rest of the package include epoxy and solder.

The chip-tube may be in the form of a backplate of an elastic material having a (TCE) closely matched to that of silicon which is used to mount the silicon die. In order to reduce the effects of thermal hysteresis and sensor sensitivity drift, the backplate is made of a size so that the hysteresis-prone materials are small by comparison and so have a small strain transfer effect on the larger and comparatively stiffer backplate. The backplate material is usually Pyrex™, but it can be silicon, SD2 glass, ceramic or other materials. The use of these materials entails tradeoffs between performance and the available packaging space and, to a degree, cost. However, no matter how large the elastic backplate, all strains cannot be eliminated and the problem is exacerbated at higher temperatures. The backplate must then be secured to another package material that is different from the backplate material.

New application needs continue to emerge for pressure sensing devices that are able to survive extreme environments of temperature and pressure. For example, the high temperatures found in internal combustion engine testing applications and the high pressures required for down-hole oil drilling applications. In addition to the temperature and pressure requirements, there is a need for pressure sensing devices that can withstand the forces due to acceleration and shock associated with various applications related to investigating or exploring geologic formations. Fluid pressure measurements associated with geologic exploration also require pressure-sensing units that accommodate liquids containing solids while allowing transmission of the pressure of the liquid. U.S. Pat. No. 6,046,667, which is assigned to Honeywell Inc., describes a pressure transducer with porous material for media isolation and is hereby incorporated by reference. In such applications the process of placing the pressure-sensing device at the desired point of measurement would subject it to high acceleration forces. For example U.S. Pat. No. 6,028,534, issued to Schlumberger Technology Corporation, describes the use of pressure sensing devices or intelligent sensors that can be positioned within a formation of interest by any suitable means. One example provided is a hydraulically energized ram that can propel the sensor into the formation causing it to penetrate the formation to a sufficient depth to allow the sensing of formation data. An alternative means is drilling into the formation with the sensor then being positioned in the drilled hole by a sensor actuator. A further alternative means is a propellant energized onboard the drill collar which can be activated to fire the sensor with sufficient force to penetrate into the formation laterally beyond the well bore. It can be appreciated that a sensor would need to be capable of surviving the forces of acceleration and deacceleration associated with these and other methods used to place the sensor at the desired measurement location. In addition, size and shape constraints of the complete sensor that will permit deployment as described above limit the space available for the transducer and its package. For example, the constraints do not permit the use of a chip-tube of a few tenths of an inch in length.

Thus a need exists for sensing units that are capable of sensing pressure and temperature, and can survive the high acceleration forces that will be encountered in placing the devices in the desired measurement location.

SUMMARY OF THE INVENTION

The present invention solves these and other needs by providing a transducer packaging assembly for use in a sensing unit subjected to high forces of acceleration. A pressure sensitive die has a backside bonded to a large backplate. A base includes a cavity that is shaped to receive the combination of the backplate and the pressure sensitive die with the backplate spaced from the surface of the cavity.

A planar cover secured to the base has a hole larger than the die but smaller than the backplate. Thin wires extend from the pressure sensitive die to electrical connections on the cover. A viscous fluid fills a space between the backplate and the cavity and a space between the backplate and the cover and transmits a pressure to be measured to the pressure sensitive die while cushioning the combination of the pressure sensitive die and backplate from forces of acceleration. A thin semipermeable material is immersed in the viscous fluid and surrounds a portion of the backplate to aid in centralizing and cushioning the backplate.

DETAILED DESCRIPTION

Figure 1:
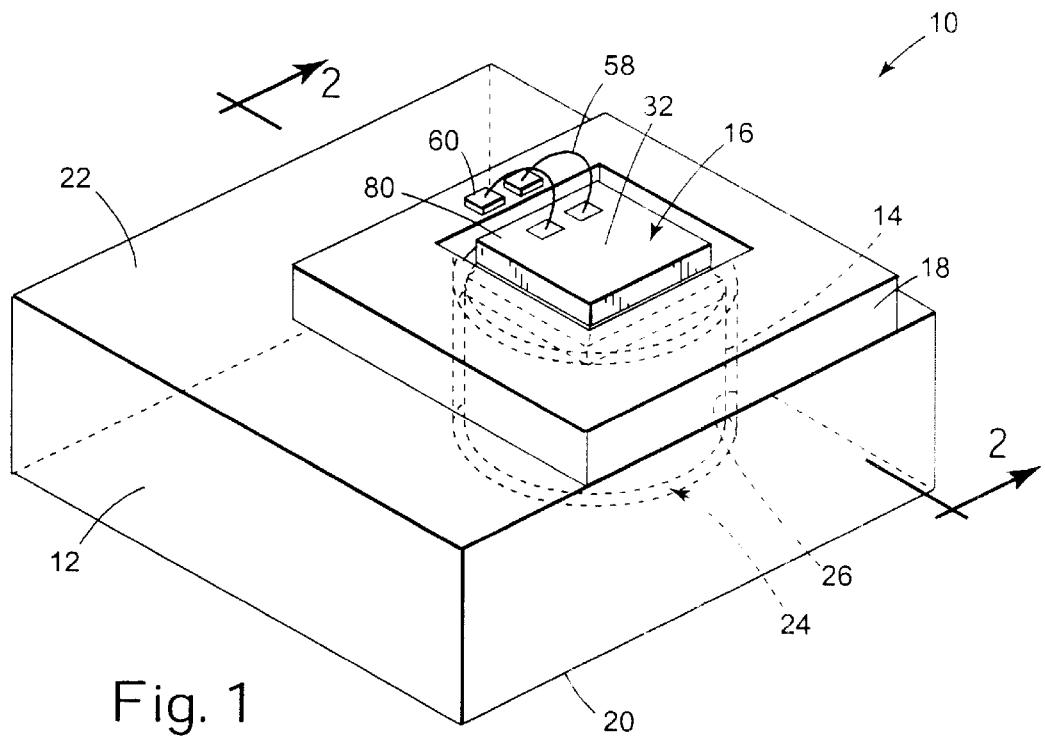
FIG. 1 shows a perspective view of a transducer packaging assembly according to the teachings of the present invention.
Figure 2:
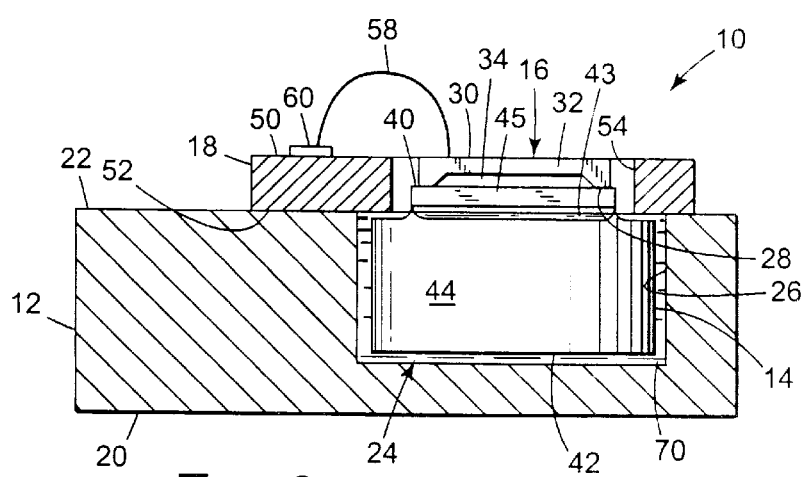
FIG. 2 shows a cross-sectional view of the transducer packaging assembly of FIG. 1 according to section line 2—2 of FIG. 1.

A pressure transducer assembly intended to withstand extremely high G forces is shown in the drawings and is generally designated 10. Assembly 10 includes base 12, backplate 14, semiconductor die 16 and cover 18. Base 12 has a lower or resting surface 20 and an upper or opposite surface 22. The material for base 12 needs to have qualities of stiffness, strength and toughness sufficient to withstand the acceleration forces in the intended application. Stiffness is related to the ability to resist bending; strength relates to resistance to breaking; and toughness relates somewhat to the ability to withstand forces even if a minor defect exists in the material. In one anticipated application of a pressure transducer in a projectile-shaped pressure sensing unit for forcibly penetrating a geologic formation, it is expected that packaging assembly 10 will experience acceleration forces in excess of 50,000 G's. In this application, it is expected that the use of titanium or equivalent strength steel as a material for base 12 will provide satisfactory performance. Other materials could be used. In such applications, consideration may need to be given to the density of materials used in packaging assembly 10 and the effect on the performance of the projectile-shaped pressure sensing unit, for example the effect on the center of gravity of the projectile-shaped unit. Base 12 includes a cavity or recess 24 formed therein and having a cavity opening 26 in upper surface 22. Semiconductor die 16 is preferably of silicon and is constructed using micro-machining and IC fabrication techniques. Die 16 includes backside 28 and frontside 30. A recess is formed by etching at backside 28 of die 16 and a remaining unetched portion forms a diaphragm 32. Frontside 30 includes strain-sensitive resistors (not shown) formed by ion implantation. The strain-sensitive resistors are located in specific relationship to diaphragm 32 so as to provide a desired response to strain as is well known. The strain-sensitive resistors are typically interconnected into a Wheatstone bridge arrangement. A reference pressure is contained in space 34 which exists between diaphragm 32 and surface 40 of backplate 14. Backplate 14 is formed of silicon or Pyrex™ or other suitable material of sufficient thickness or stiffness to prevent die 16 from bending. Material for backplate 14 is usually chosen for its high elasticity and a thermal coefficient of expansion (TCE) that matches or is very close to the TCE of die 16. Backplate 14 includes upper surface 40, lower surface 42 and side 44. Backplate 14 also includes flat surface portion 41, filet or curved portion 43 and flat portion 45. Die 16 is secured at backside 28 to upper surface 40 of backplate 14. Upper surface 40 is sized so that die 16 is spaced inwardly from the edge of surface 40. Die 16 may be secured by thermoelectric bonding or other suitable means.

Cover 18 is planar, having upper surface 50 and lower surface 52. Cover 18 further includes a hole 54 having a perimeter which is of the same shape but is larger than a perimeter of die 16. Cover 18 may be a ceramic interconnect board. Thin wires 58 extend between sensing die 16 and electrical connections 60 located on cover 18. The electrical connections could, of course, be at other locations on assembly 10, for example, on an additional part (not shown) located above cover 18 depending on the application. The method of constructing assembly 10 according to the teachings of the present invention includes the following steps:

1) The combination of backplate 14 with die 16 secured is nestled into cavity 24 which is just slightly larger than backplate 14, but of the same shape as backplate 14.

2) A temporary bond is made between lower surface 42 of backplate 14 and a surface at the bottom of cavity 24.

3) Cover 18 having hole 54 is bonded to upper surface 22 of base 12.

4) Thin wires 58 are connected between sensing die 16 and electrical connections 60 on cover 18.

5) The temporary bond between lower surface 42 of backplate 14 and a surface at the bottom of cavity 24 is removed.

6) A viscous fluid 70 is introduced to fill a space between backplate 14 and cavity 24 and a space between backplate 14 and cover 18 with viscous fluid 70 transmitting a pressure to be measured to pressure sensitive die 16.

Figure 5:
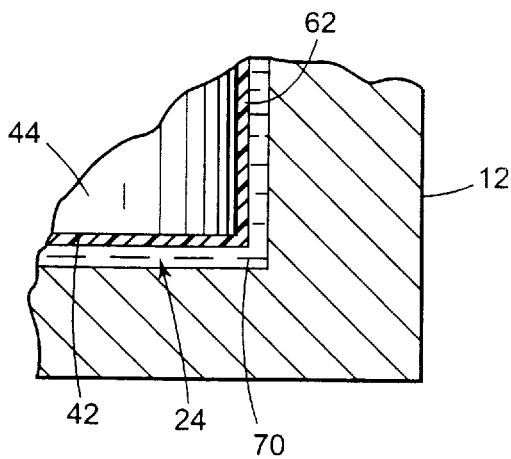
FIG. 5 shows an enlarged partial view of a portion of FIG. 2 to illustrate certain features of the present invention.
Figure 6:
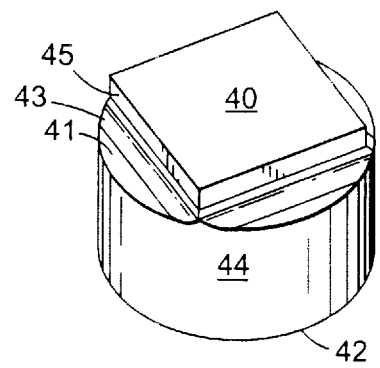
FIG. 6 is a perspective view of a portion of FIG. 2 to illustrate certain features of the present invention.

An alternative to forming the temporary bond of step 2 is to devise another means for preventing contact of lower surface 42 of backplate 14 with a bottom surface of cavity 24. A thin sheet of plastically deformable semipermeable material 62, e.g., Teflon™ tape may be placed over cavity 24 prior to placing the combination of die 16 and backplate 14 into cavity 24. Material 62 is then permanently deformed when the combination of die 16 and backplate 14 are placed into cavity 24 as shown in FIG. 5. After viscous fluid 60 is introduced, material 62 assists in maintaining the combination of die 16 and backplate 14 centered within cavity 24. Experiments indicate that the survivability of assembly 10, when subjected to high G forces, appears to be improved by the use of material 62 which acts to keep backplate 14 centered in cavity 24.

When located in cavity 24 backplate 14 is separated from base 12 by viscous fluid or fill fluid 70. Backplate 14 is also separated from surface 52 of cover 50 by viscous fluid or fill fluid 70. Cover 50 retains backplate 14 in cavity 24. Surface 43 of backplate 14 is spaced from the edge of hole 54.

Viscous fluid 70 may be selected from a variety of hydraulic fluids. For example, high viscosity-silicone fluids are available from Dow Corning Corporation, Midland, Mich. 48686-0994. Fluid 70 surrounding surface 44 of backplate 14 performs a function of isolating die 16 from acceleration forces. That is, fluid 70 provides an opposing distributed force against backplate 14 that resists or impedes movement of backplate 14 relative to cavity 24. The present invention is useful in widely varying applications. The magnitude and nature of the acceleration forces that assembly 10 must withstand, the spacing to be provided between backplate 14 and cavity 24 and the viscosity of fluid 70 are related variables that need to be considered in view of a specific application. The ability of fluid 70 to resist movement of backplate 14 relative to cavity 24 increases with viscosity and with a reduction in the spacing between backplate 14 and a surface of cavity 24. In one anticipated application of a pressure transducer in a projectile-shaped pressure sensing unit for penetrating a geologic formation, it is believed that clearances between surface 44 of backplate 14 and the surface of cavity 24 in the range of about 0.001 inches to about 0.003 inches, and a fluid 70 having a viscosity of about 10,000 centistokes or higher will provide satisfactory performance. Considerations in the selection of the viscosity of fluid 70 may include tradeoffs between the spacing between backplate 14 and cavity 24 and the viscosity of fluid 70. The choice of the spacing between backplate 14 and a surface of cavity 24 will typically give consideration to how controllably small of a spacing can be achieved, machining tolerances, viscosity of fluid 70 and other factors. In the preferred embodiment, viscous fluid 70 is selected to have a density equal to the density of the combination of backplate 14 and die 16. When a fluid of this density is used, then under conditions of acceleration or deceleration there will be no force acting on the combination of sensor die 16 and backplate 14 to cause the combination to move relative to fluid 70. Fluid 70 may be a single-phase material with the same density as the die backplate combination. It should be recognized that the density of the single-phase fill fluid will exactly match the density of the combination of die 16 and backplate 14 only at one temperature. Slight density imbalances due to temperature dependent density changes will produce some force loading on assembly 10 as assembly 10 is accelerated or decelerated. Alternatively, fluid 70 may be a multicomponent fluid, for example a low density, low viscosity liquid phase combined with a high-density solid phase made of, for example, small spheres of glass or small particles of materials having a greater density than glass. With materials having a greater density, less of the material is needed. Examples of such materials include oxides of heavy metals such as lead, barium or lanthium. Titanates of metals such as barium or lanthium may also be used. An additional advantage of this type of fill fluid is that its thermal coefficient of expansion can be tailored to more closely match the TCE of the combination of die 16 and backplate 14, thereby providing a better density match over a wider range of temperatures.

Base cavity 24 is shown as having a circular opening and backplate 14 is shown as having a lower portion having a circular cross-section which nestles in cavity 24. Base cavity 24 could be made with a rectangular cross section that would receive a backplate having a rectangular cross section. This would introduce different possible contact points between backplate 14 and the surface of cavity 24. It is believed that the absence of corners in the cavity and on the backplate in the embodiment shown may contribute to the ability of assembly 10 to withstand high G forces.

Other shapes for cavity 24 could of course be used.

Figure 3:
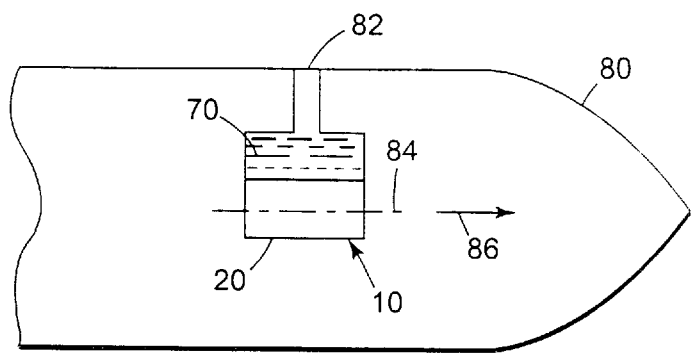
FIG. 3 shows a cross-sectional view of a portion of a pressure-sensing unit having the transducer packaging assembly of FIG. 1 mounted therein.
Figure 4:
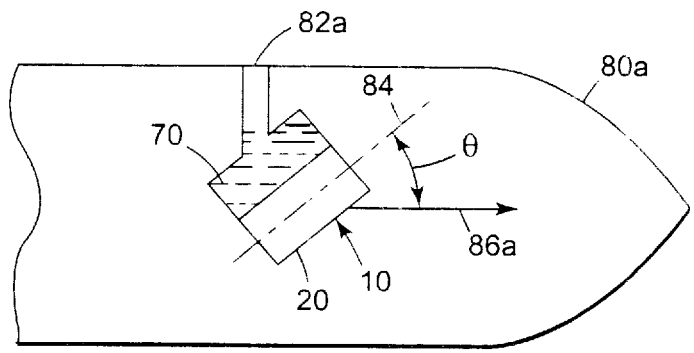
FIG. 4 shows a cross-sectional view of a portion of a pressure-sensing unit having the transducer packaging assembly of FIG. 1 in an alternative mounting arrangement.

Assembly 10 may be mounted into a larger device in a variety of ways depending on the application. For example, FIG. 3 shows assembly 10 mounted within a pressure sensing unit 80 having a projectile shape for forcibly penetrating a geologic formation. In this application a pressure port 82 would permit the transmission of a liquid pressure within the formation to assembly 10. Porous filter means (not shown) or other isolation means would be needed and could be located between the liquid media and assembly 10. Assembly 10 may also be more or less susceptible to acceleration forces depending on the direction in which the acceleration force acts on assembly 10. For example, FIG. 3 shows assembly 10 mounted in a pressure sensing unit 80 having a projectile shape so that the maximum acceleration force during acceleration and deceleration will occur along a direction 86 that is parallel to axis 84 and to surface 20 of base 12. The construction of device 10, and how susceptible it is to forces in different directions, may make it desirable to have the maximum force act in some other direction through assembly 10. It may be that the ability of assembly 10 to withstand an acceleration force is significantly greater if assembly 10 is oriented so that a direction of axis 84 is at a forty-five (45) degree angle to a direction of an acceleration force. In such an application, according to the principles of the present invention, the orientation of assembly 10 may be as shown in FIG. 4 where assembly 10 is oriented so that surface 20 of base 12 and axis 84 are at a forty-five (45) degree angle to a direction of acceleration force 86*a*. The choice of angle theta of course is dependent on the specific application.

Transducer 10 has been described only in terms of a pressure sensitive die 16. Die 16 may include other sensing elements or transducers. For example die 16 may include a resistance temperature transducer that will provide a signal related to a temperature of die 16.

Thus since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than the foregoing description, and all changes which come within the meaning and range of equivalency of the claims are intended to be embraced therein.

What is claimed is:

1. A transducer packaging assembly for use in a sensing unit having a passage filled with a viscous fluid for transmitting a pressure to be measured to said packaging assembly, said sensing unit subjected to high forces of acceleration, comprising:

a pressure sensitive die having a frontside and a backside, said frontside having electrical connections;

a backplate, said backplate having a thickness and a shape;

means for bonding said backside to said backplate;

a base having a cavity, said cavity having a shape conforming to said shape of said backplate with said cavity being of a size so that said backplate nestles in said cavity and is spaced from a surface of said cavity;

said viscous fluid filling a space between said backplate and said cavity, with said fluid transmitting said pressure to be measured to said pressure sensitive die;

means for retaining said backplate within said cavity; and said backplate moveable and floatable within said cavity with said viscous fluid having a viscosity sufficient to impede movement of said backplate relative to said cavity due to forces of acceleration.

2. The transducer packaging assembly of claim 1 wherein said means for retaining said backplate within said cavity comprises a cover, said cover secured to said base and having an opening larger than said die and smaller than said backplate, with said viscous fluid filling a space between said backplate and said cover.

3. The transducer packaging assembly of claim 1 wherein said backplate comprises a circular cross-section portion for complementary receipt in said cavity, a transition portion and a termination portion having a rectangular cross section.

4. The transducer packaging assembly of claim 1 wherein said backplate is formed from a material selected from the group consisting of silicon, Pyrex™, and SD2 glass.

5. The transducer packaging assembly of claim 1 further comprising a thin sheet of a semipermeable material immersed in said viscous fluid and surrounding a portion of said backplate.

6. The transducer packaging assembly of claim 1 wherein said viscous fluid comprises particles of a material selected so that the density of said viscous fluid is equal to the density of said combination of said pressure sensitive die and said backplate.

7. The transducer packaging assembly of claim 6 wherein said material for said particles comprises an oxide or a titanate of a heavy metal.

8. The transducer packaging assembly of claim 1 wherein a capability of said assembly to withstand an acceleration force varies with a direction of said acceleration force and said assembly is oriented in said sensing unit so that a greater acceleration force occurs in a direction of a greater capability to withstand said greater acceleration force.

9. The transducer packaging assembly of claim 1 further comprising electrical conductors attached to said electrical connections.

10. The transducer packaging assembly of claim 1 wherein said pressure sensitive die includes a resistance temperature bridge.

11. A transducer packaging assembly for use in a sensing unit having a passage filled with a viscous fluid for transmitting a pressure to be measured to said packaging assembly, said sensing unit subjected to high forces of acceleration, comprising:
a pressure sensitive die having a frontside and a backside;
a backplate having a lower portion, a transition portion and a termination portion;
means for bonding said backside to said backplate;
a base having a cavity, said cavity having a shape for complementary receipt of said lower portion with said cavity being of a size so that said lower portion nestles in said cavity and is spaced from a surface of said cavity;
a cover secured to said base, said cover having an opening larger than said die and smaller than said backplate;
thin wires extending from said frontside of said pressure sensitive die; and
said viscous fluid filling a space between said backplate and said cavity and a space between said backplate and said cover, said viscous fluid transmitting said pressure to be measured to said pressure sensitive die with said backplate moveable and floatable in said cavity and said viscous fluid opposing movement of said backplate relative to said cavity, with said combination of said pressure sensitive die and said backplate cushioned by said viscous fluid from forces of acceleration.

12. The transducer packaging assembly of claim 11 wherein said lower portion comprises a circular cross-section portion and said termination portion has a rectangular cross section.

13. The transducer packaging assembly of claim 11 wherein said backplate is formed from a material having a TCE substantially equal to a TCE of said pressure sensitive die.

14. The transducer packaging assembly of claim 11 wherein a capability of said assembly to withstand an acceleration force varies with a direction of said acceleration force and said assembly is oriented in said sensing unit so that a greater acceleration force occurs in a direction of a greater capability to withstand said greater acceleration force.

15. The transducer packaging assembly of claim 11 further comprising a thin sheet of a semipermeable material immersed in said viscous fluid and surrounding a portion of said backplate.

16. The transducer packaging assembly of claim 11 wherein said viscous fluid is a single-phase fluid.

17. The transducer packaging assembly of claim 11 wherein said viscous fluid is a multiphase fluid.

18. A method of constructing a transducer assembly having a pressure sensitive die for use in a sensing unit subjected to high forces of acceleration, said sensing unit having a passage for transmitting a pressure to be measured to said pressure sensitive die, comprising the following steps:
providing a backplate having said pressure sensitive die bonded thereto;
providing a base having a cavity slightly larger than said backplate but of the same shape as said backplate;
nestling said backplate into said cavity with said backplate maintained in a spaced relationship to a surface of said cavity;
bonding a cover to said base, said cover having a hole larger than said pressure sensing die but smaller than said backplate;
making electrical connections at said pressure sensitive die; and
filling a space between said backplate and said cavity, a space between said backplate and said cover, and said passage with a viscous fluid, said viscous fluid transmitting said pressure to be measured to said pressure sensitive die with said backplate movable and floatable in said cavity and said viscous fluid cushioning said pressure sensitive die and said backplate from forces of acceleration.

19. The method of claim 18 wherein said step of nestling said backplate into said cavity with said backplate maintained in a spaced relationship to a surface of said cavity comprises the step of placing a thin sheet of semipermeable material over said cavity before nestling said backplate into said cavity.

20. The method of claim 18 wherein the step of filling a space between said backplate and said cavity and a space between said backplate and said cover with a viscous fluid comprises the step of providing a viscous fluid comprising particles of a material selected so that the density of said viscous fluid is equal to the density of said combination of said pressure sensitive die and said backplate.

21. The method of claim 18 further comprising the step of mounting the transducer packaging assembly in a sensing unit so that said assembly is oriented in said sensing unit so that a greater acceleration force occurs in a direction of a greater capability to withstand said greater acceleration force.

* * * * *